(12) United States Patent
Du et al.

(10) Patent No.: US 11,151,910 B2
(45) Date of Patent: Oct. 19, 2021

(54) FLEXIBLE DISPLAY PANEL FOR DISPLAY DEVICE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Sen Du, Beijing (CN); Jianpeng Wu, Beijing (CN); Fengli Ji, Beijing (CN); Wei Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/634,326

(22) PCT Filed: Jan. 4, 2019

(86) PCT No.: PCT/CN2019/070500
§ 371 (c)(1),
(2) Date: Jan. 27, 2020

(87) PCT Pub. No.: WO2020/140293
PCT Pub. Date: Jul. 9, 2020

(65) Prior Publication Data
US 2021/0074188 A1   Mar. 11, 2021

(51) Int. Cl.
H05K 7/00       (2006.01)
G09F 9/30       (2006.01)
H05K 1/02       (2006.01)
H01L 27/32      (2006.01)
H01L 51/00      (2006.01)

(52) U.S. Cl.
CPC .............. *G09F 9/301* (2013.01); *H05K 1/028* (2013.01); *H01L 27/323* (2013.01); *H01L 51/0097* (2013.01); *H01L 2251/5338* (2013.01)

(58) Field of Classification Search
USPC ........................................................ 361/749
See application file for complete search history.

(56) References Cited

U.S. PATENT DOCUMENTS

| 2015/0108439 | A1  | 4/2015 | Kim et al.              |
|--------------|-----|--------|-------------------------|
| 2015/0173172 | A1* | 6/2015 | Yang ............ G02F 1/133305 |
|              |     |        | 361/749                 |
| 2016/0231850 | A1* | 8/2016 | Choi ............... G06F 1/1652 |
| 2017/0092703 | A1  | 3/2017 | Bae et al.              |

FOREIGN PATENT DOCUMENTS

| CN | 105278139 A | 1/2016  |
|----|-------------|---------|
| CN | 106444119 A | 2/2017  |
| CN | 108648719 A | 10/2018 |

* cited by examiner

*Primary Examiner* — Andargie M Aychillhum
(74) *Attorney, Agent, or Firm* — Dilworth & Barrese, LLP.; Michael J. Musella, Esq.

(57) ABSTRACT

A flexible display panel for a display device and a display device are provided. The flexible display panel includes: a first display portion and a second display portion connected with the first display portion. A color temperature of a first white image displayed by the first display portion in a flat state is different from a color temperature of a second white image displayed by the second display portion in the flat state.

19 Claims, 3 Drawing Sheets

FLEXIBLE DISPLAY PANEL FOR DISPLAY DEVICE AND DISPLAY DEVICE

TECHNICAL FIELD

Embodiments of the present disclosure relate to a flexible display panel for a display device, and a display device.

BACKGROUND

In recent years, with the progress of display technologies, organic light emitting diode (OLED) display is one of the hotspots in the research field of flat panel displays. More and more active matrix organic light emitting diode (AMOLED) display panels have entered the market. Compared with traditional thin film transistor liquid crystal display (TFT LCD), AMOLED has a faster respond speed, a higher contrast and a wider viewing angle. With the development of display technologies, more and more electronic devices begin to use curvable and flexible OLED display screens that are light and thin and have good impact resistance.

Traditional display technologies all adopt a single display mode. During viewing, when the orientation of the viewer changes, the display picture cannot be changed according to the orientation change of the viewer. For example, when the viewing direction of the user changes from the front to an oblique direction, the brightness, contrast and color gamut of the liquid crystal display device will change, resulting in a degenerated visual effect. In particular, for some high-end display or special display occasions, such as medical treatment, graphic design and other fields, the requirement for controlling the viewing angle color shift (color difference of different viewing angles) is high, and the viewing angle color shift of a common display panel needs to be improved.

SUMMARY

One embodiment of the present disclosure provides a flexible display panel for a display device, wherein the display device includes a flat display portion and a bent display portion, the flexible display panel includes a first display portion and a second display portion connected with the first display portion, the first display portion is configured as the flat display portion, the second display portion is configured as the bent display portion, the first display portion in a flat state and the second display portion in a flat state are configured to display a first white image and a second white image respectively at the same time, and a color temperature of the second white image is different from a color temperature of the first white image.

In one example, the flexible display panel is an electroluminescent display panel, and each pixel unit in the first display portion and the second display portion includes at least a first primary color sub-pixel and a second primary color sub-pixel, wherein in a case where the first display portion in the flat state displays the first white image and the second display portion in the flat state displays the second white image, an intensity ratio of light emitted by the second primary color sub-pixel in the first display portion to light emitted by the first primary color sub-pixel in the first display portion is different from an intensity ratio of light emitted by the second primary color sub-pixel in the second display portion to light emitted by the first primary color sub-pixel in the second display portion.

In one example, an effective light emitting area of the second primary color sub-pixel in the second display portion is larger than an effective light emitting area of the second primary color sub-pixel in the first display portion.

In one example, a dye doping concentration of a light emitting layer of the second primary color sub-pixel in the first display portion is smaller than a dye doping concentration of a light emitting layer of the second primary color sub-pixel in the second display portion.

In one example, a difference between the color temperature of the first white image and the color temperature of the second white image is greater than or equal to 2000 K.

In one example, the color temperature of the first white image is less than the color temperature of the second white image.

In one example, the first display portion and the second display portion are directly connected.

In one example, a part of the first display portion is configured to display a reference white image in a bending state, the reference white image having a color shift of a first color with respect to the first white image, the second white image has a color shift of a second color with respect to the first white image, and the first color and the second color are complementary colors to each other.

In one example, each pixel unit in the first display portion and the second display portion further includes a third primary color sub-pixel, a ratio of effective light emitting areas of the first primary color sub-pixel, the second primary color sub-pixel and the third primary color sub-pixel in each pixel unit of the first display portion is X:Y:Z, a ratio of effective light emitting areas of the first primary color sub-pixel, the second primary color sub-pixel and the third primary color sub-pixel in each pixel unit of at least a first sub-region of the second display portion is X:(m1×Y):(n1×Z), where m1 is greater than or equal to 1, and n1 is greater than or equal to 1.1.

In one example, a ratio of effective light emitting areas of the first primary color sub-pixel, the second primary color sub-pixel and the third primary color sub-pixel in each pixel unit of at least a second sub-region of the second display portion is X:(m2×Y):(n2×Z), where m2>m1, and n2>n1; wherein the second sub-region is further away from the first display portion than the first sub-region.

In one example, in a case where the first display portion in the flat state displays the first white image and the second display portion in the flat state displays the second white image, color temperatures of the first white image, a first sub-white image displayed in the first sub-region and a second sub-white image displayed in the second sub-region sequentially increase or sequentially decrease.

In one example, the first primary color sub-pixel, the second primary color sub-pixel and the third primary color sub-pixel are a red sub-pixel, a green sub-pixel and a blue sub-pixel, respectively.

Another embodiment of the present disclosure provides a display device including: a support member and any one flexible display panel described above, wherein the support member has a flat support surface and a bent support surface adjacent to each other, the first display portion of the flexible display panel is bonded to the flat support surface as the flat display portion, and the second display portion of the flexible display panel is bonded to the bent support surface as the bent display portion.

In one example, the flexible display panel is an electroluminescent display panel, and each pixel unit in the flat display portion and the bent display portion includes at least a first primary color sub-pixel and a second primary color sub-pixel, in a case where the flat display portion displays the first white image and the bent display portion displays the second white image, an intensity ratio of light emitted by the second primary color sub-pixel in the flat display portion to light emitted by the first primary color sub-pixel in the flat display portion is different from an intensity ratio of light emitted by the second primary color sub-pixel in the bent display portion to light emitted by the first primary color sub-pixel in the bent display portion.

In one example, the bent display portion is configured to display a third white image, and a difference between the color temperature of the first white image and a color temperature of the third white image is less than or equal to 500 K.

In one example, each pixel unit in the flat display portion and the bent display portion further includes a third primary color sub-pixel, a ratio of effective light emitting areas of the first primary color sub-pixel, the second primary color sub-pixel and the third primary color sub-pixel in each pixel unit of the flat display portion is X:Y:Z, a ratio of effective light emitting areas of the first primary color sub-pixel, the second primary color sub-pixel and the third primary color sub-pixel in each pixel unit of at least a first sub-portion of the bent display portion is $X:(m1 \times Y):(n1 \times Z)$, where $m1 \geq 1$, and $n1 \geq 1.1$.

In one example, a ratio of effective light emitting areas of the first primary color sub-pixel, the second primary color sub-pixel and the third primary color sub-pixel in each pixel unit of at least a second sub-portion of the bent display portion is $X:(m2 \times Y):(n2 \times Z)$, where $m2 \geq m1$, and $n2 \geq n1$; wherein the second sub-portion is further away from the flat display portion than the first sub-portion.

In one example, the first sub-portion is configured to display a fourth sub-white image, the second sub-portion is configured to display a fifth sub-white image, and a difference between a color temperature of the fourth sub-white image and a color temperature of the fifth sub-white image is less than or equal to 200 K.

In one example, the first primary color sub-pixel, the second primary color sub-pixel and the third primary color sub-pixel are a red sub-pixel, a green sub-pixel and a blue sub-pixel, respectively.

In one example, a surface of the flat display portion away from the support member is located in a first plane, in a cross-section of the display device, the bent support surface has a curved shape, a tangent line of a surface of the first sub-portion away from the support member forms a first included angle a1 with the first plane, a tangent line of a surface of the second sub-portion away from the support member forms a second included angle a2 with the first plane, the first included angle a1 and the second included angle a2 are both acute angles, and the second included angle a2 is larger than the first included angle a1.

Because the color temperature of the first white image displayed by the first display portion in the flat state is different from the color temperature of the second white image displayed by the second display portion in the flat state, color shift caused by bending of the second display portion can be offset, so that the first display portion in the flat state and the second display portion in the bending state have more color consistency, such as having the same color temperature, when displaying a white image simultaneously.

BRIEF DESCRIPTION OF THE DRAWINGS

In order to clearly illustrate the technical solutions in the embodiments of the present disclosure and related art, the drawings needed to describe the embodiments and related art will be briefly described in the following; it is obvious that the described drawings are only related to some embodiments of the present disclosure. For those skilled in the art, other drawings can be obtained according to these drawings without any inventive work.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly. In order to keep the following description of the embodiments of the present disclosure clear and concise, detailed descriptions of known functions and known components may be omitted.

An OLED display screen mainly realizes image display by driving electroluminescent elements to emit light through current. The inventors have found that due to factors such as the structural characteristics of the electroluminescent elements and the manufacturing process of the display screen, etc., color shift may occur on the display screen in a large field of view, particularly, in the bent area after the display screen is bent, the color shift phenomenon is more significant, thereby affecting the display effect of the display screen.

The present disclosure provides a flexible display panel and a display device including the flexible display panel, which can improve the front viewing color shift problem of an edge region of the flexible display panel in a bending state, thereby improving the display effect of the display panel.

Figure 1:
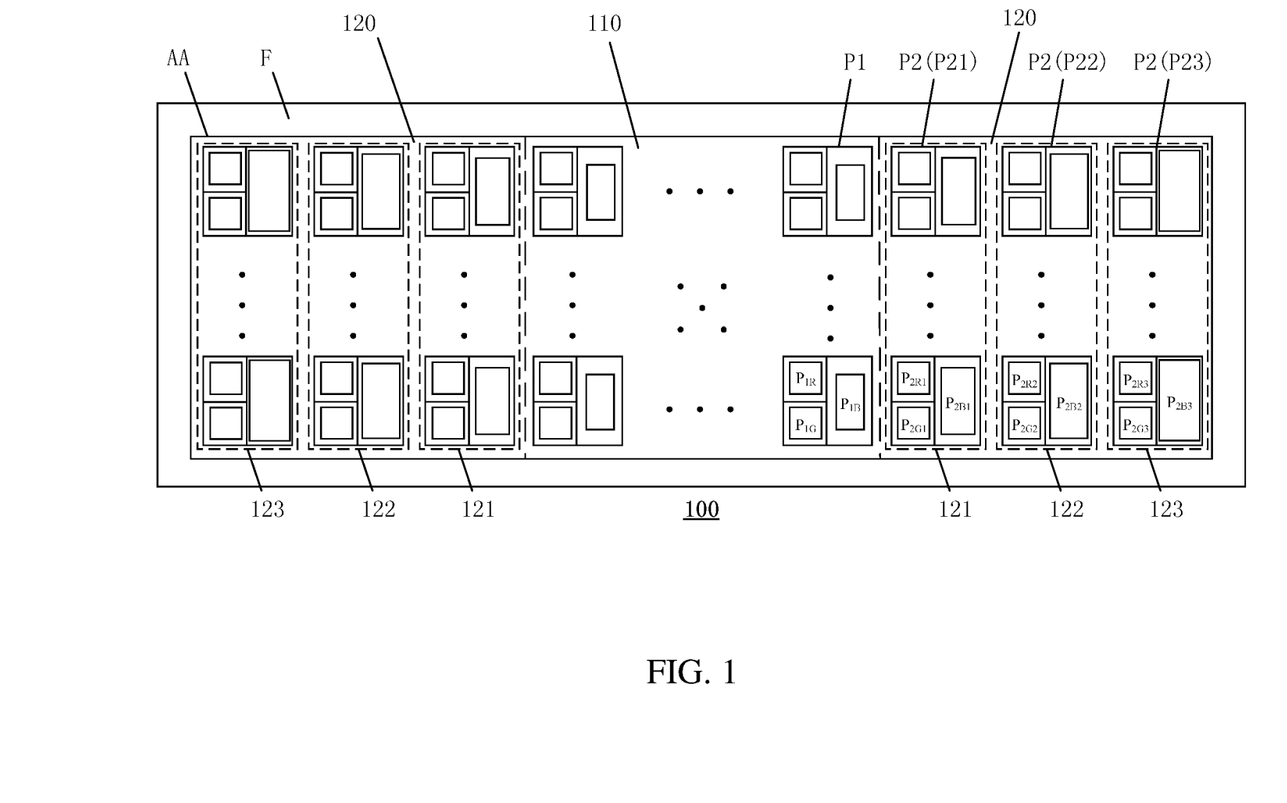
FIG. 1 shows a schematic plan view of a flexible display panel in a flat state provided by an embodiment of the present disclosure.

The embodiments of the present disclosure provide a flexible display panel 100 for a display device. The flexible display panel 100 is, for example, an organic electroluminescent display panel. The display device includes a flat display portion and a bent display portion. FIG. 1 shows a schematic plan view of a flexible display panel in a flat state provided by an embodiment of the present disclosure. Referring to FIG. 1, the flexible display panel 100 includes: a main display portion 110 (an example of a first display portion) and two edge display portions 120 (an example of a second display portion) connected to the main display portion 110. The first display portion is configured as the flat display portion and the at least one second display portion is configured as the bent display portion. The two edge display portions 120 are respectively located on opposite sides of the main display portion 110. In the plan view shown in FIG. 1, each edge display portion 120 is directly connected to the main display portion 100, so there is no non-display portion between each edge display portion 120 and the main display portion 100. The main display portion 110 and the two edge display portions 120 together constitute a continuous effective display portion AA of the flexible display panel 100. The boundary of the effective display portion AA is adjacent to a non-display portion F. The embodiments of the present disclosure does not limit the number of edge display portions 120 included in the flexible display panel 100, as long as the edge display portions 120 are located at the periphery of the main display portion. In one example, the flexible display panel 100 may include only one edge display portion 120; in another example, the flexible display panel 100 may include three or more edge display portions 120. In another example, there may be a non-display portion between at least one edge display portion 120 and the main display portion 100. In this case, the effective display portion AA of the flexible display panel 100 composed of the main display portion 110 and the two edge display portions 120 can be discontinuous.

The main display portion 110 includes a plurality of main pixel units P1 arranged in an array, and each edge display portion 120 includes a plurality of edge pixel units P2 arranged in an array.

The main display portion 110 is configured to display a first white image in a flat state. The edge display portion 120 is configured to display a second white image in a flat state.

Color temperature is a measurement unit that indicates color component contained in a light beam. Theoretically speaking, color temperature refers to the color of absolute black body after heated from absolute zero (−273° C.). The black body gradually changes from black to red, to yellow, to white, and finally emits blue light after being heated. When heated to a certain temperature, the light emitted by the black body contains a specific spectral component, therefore the temperature is referred to as the color temperature of the light with the specific spectral component, and the measurement unit is "K" (Kelvin). If the light emitted by a certain light source has the same spectral component as the light emitted by a blackbody at a certain temperature, that is, has a certain K color temperature.

When the main display portion 110 in a flat state is driven to display the first white image at a first time instant, each main pixel unit P1 within the main display portion 110 is driven to display a white pixel point. The white pixel point displayed by each main pixel unit P1 has a corresponding color temperature. The arithmetic average value of the color temperatures of the white pixel points respectively displayed by all the main pixel units P1 in the main display portion 110 is the color temperature of the first white image displayed by the main display portion. For example, the color temperature of the first white image is 6500 K.

When the edge display portion 120 in a flat state is driven to display the second white image at the first time instant, each edge pixel unit P2 within the edge display portion 120 is driven to display a white pixel point. The white pixel point displayed by each edge pixel unit P2 has a corresponding color temperature. The arithmetic average value of the color temperatures of the white pixel points respectively displayed by all the edge pixel units P2 in the edge display portion 120 is the color temperature of the second white image displayed by the edge display portion 120.

Because the color temperature of the first white image displayed by the main display portion 110 in the flat state is different from the color temperature of the second white image displayed by the edge display portion 120 in the flat state at the same time instant, color shift caused by bending of the edge display portion 120 can be offset, so that the main display portion 110 in the flat state and the edge display portion 120 in the bending state have more color consistency, such as having the same color temperature, when displaying a white image at the same time.

The color temperature of the first white image is different from the color temperature of the second white image. For example, the difference between the color temperature of the first white image and the color temperature of the second white image is greater than or equal to 2000 K. For example, the difference between the color temperature of the first white image and the color temperature of the second white image is greater than or equal to 3500 K. For example, the color temperature of the first white image is less than the color temperature of the second white image. The color temperature difference in this range can more effectively adjust the color shift caused by the bending of the flexible display panel.

For example, a part of the main display portion 110 is configured to display a reference white image in a bending state, and the reference white image has a color shift of a first color with respect to the first white image. For example, the color shift in the present disclosure refers to a front viewing color shift that can be observed when the central line of the observer's sight is perpendicular to the part of the main display portion 110 in the flat state. For example, the first color is, for example, red. That is, the reference image is reddish with respect to the first white image. When the edge display portion 120 in the flat state is driven to display a second white image, the second white image has a color shift of a second color with respect to the first white image displayed by the main display portion 110 in the flat state. For example, the first color and the second color are, for example, complementary colors to each other. Here, complementary colors are a pair of colors that cancel each other out (lose hue) by producing white when combined or mixed. For example, the color temperature of the second white image is 9000 K. The second color is, for example, cyan, that is, the second white image is cyanish with respect to the first white image.

Figure 3:
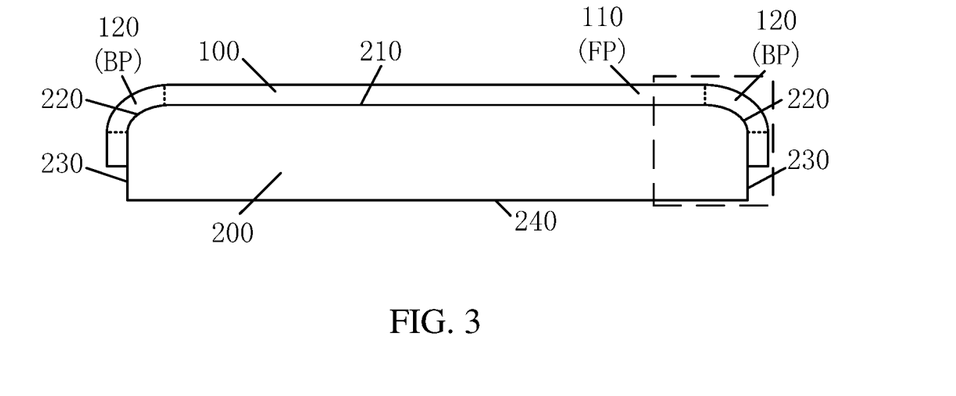
FIG. 3 shows a schematic cross-sectional view of the display device provided by the embodiment of the present disclosure along line LL' in FIG. 2.

Here, the flexible display panel 100 is configured to be combined to a support member for display. Referring to FIG. 3, the support member 200 includes a flat support surface 210 and two bent support surfaces 220. The main display portion 110 of the flexible display panel 100 is configured to be conformally combined on the flat support surface to be in the flat state for display; the edge display portion 120 of the flexible display panel 100 is configured to be conformally combined to the bent support surface to be in a bending state for display. For example, the edge display portion 120 is configured to display a third white image in a bending state at the first time instant.

When the edge display portion 120 in the bending state is driven to display the third white image, each edge pixel unit P2 within the edge display portion 120 is driven to display a white pixel point. The white pixel point displayed by each edge pixel unit P2 has a corresponding color temperature. The arithmetic average value of the color temperatures of the white pixel points respectively displayed by all the edge pixel units P2 in the edge display portion 120 in the bending state is the color temperature of the third white image displayed by the edge display portion 120. For example, the color temperature of the third white image is 6500 K.

With continued reference to FIG. 1, the edge display portion 120 includes a first sub-region 121, a second sub-region 122, and a third sub-region 123 sequentially arranged in a direction away from the main display portion 110.

The edge pixel units P2 include a plurality of first edge pixel units P21 arranged in an array in the first sub-region 121, a plurality of second edge pixel units P22 arranged in an array in the second sub-region 122, and a plurality of third edge pixel units P23 arranged in an array in the third sub-region 123. In FIG. 1, the first sub-region 121 is schematically shown by a column of first edge pixel units P21; the second sub-region 122 is schematically shown by a column of second edge pixel units P22; the third sub-region 123 is schematically shown by a column of third edge pixel units P23.

In one example, the first sub-region 121 is configured to display a first sub-white image having a first color temperature in the flat state. For example, the first color temperature is 8500 K. The second sub-region 122 is configured to display a second sub-white image having a second color temperature in the flat state. For example, the second color temperature is 9500 K. The third sub-region 123 is configured to display a third sub-white image having a third color temperature in the flat state. For example, the third color temperature is 10500K. That is, the first color temperature, the second color temperature and the third color temperature sequentially increase. In this way, compensation for gradual color shift caused after the first sub-region 121, the second sub-region 122, and the third sub-region 123 of the edge display portion 120 are attached to the bent support surface can be realized.

In the present embodiment, each main pixel unit P1 includes a red sub-pixel $P_{1R}$, a green sub-pixel $P_{1G}$, and a blue sub-pixel $P_{1B}$. Each edge pixel unit P2 includes a red sub-pixel $P_{2R}$, a green sub-pixel $P_{2G}$, and a blue sub-pixel $P_{2B}$. For example, each first edge pixel unit P21 includes a red sub-pixel $P_{2R1}$, a green sub-pixel $P_{2G1}$, and a blue sub-pixel $P_{2B1}$; each second edge pixel unit P22 includes a red sub-pixel $P_{2R2}$, a green sub-pixel $P_{2G2}$, and a blue sub-pixel $P_{2B2}$; each third edge pixel unit P23 includes a red sub-pixel $P_{2R3}$, a green sub-pixel $P_{2G3}$, and a blue sub-pixel $P_{2B3}$.

In the present embodiment, a ratio of effective light emitting areas of the red sub-pixel $P_{1R}$, the green sub-pixel $P_{1G}$, and the blue sub-pixel $P_{1B}$ in each main pixel unit P1 is X:Y:Z. A ratio of effective light emitting areas of the red sub-pixel $P_{2R1}$, the green sub-pixel $P_{2G1}$, and the blue sub-pixel $P_{2B1}$ in each first edge pixel unit P21 is X:(m1×Y):(n1×Z), where m1 is greater than or equal to 1, and n1 is greater than or equal to 1.1. In one example, m1 is equal to 1 and n1 is equal to 1.5. A blue dye doping concentration of the light emitting layer of the blue sub-pixel $P_{2B1}$ in the first edge pixel unit P21 can be greater than or equal to a blue doping concentration of the light emitting layer of the blue sub-pixel $P_{1B}$ in the main pixel unit P1. Therefore, when the main pixel unit P1 and the first edge pixel unit P21 are driven to emit white light, a ratio of blue light to red light in the white light emitted by the first edge pixel unit P21 can be greater than a ratio of blue light to red light in the white light emitted by the main pixel unit P1. In addition, a green dye doping concentration of the light emitting layer of the green sub-pixel $P_{2G1}$ in the first edge pixel unit P21 is greater than a green dye doping concentration of the light emitting layer of the green sub-pixel $P_{1G}$ in the main pixel unit P1. Thus, when the main pixel unit P1 and the first edge pixel unit P21 are driven to emit white light, a ratio of green light to red light in the white light emitted by the first edge pixel unit P21 can be greater than a ratio of green light to red light in the white light emitted by the main pixel unit P1. Therefore, the white light emitted from the first edge pixel unit P21 with the above configuration can have a larger proportion of cyan light component than the white light emitted from the main pixel unit P1 with the above configuration. In this way, it can be realized that the first color temperature of the first sub-white image displayed by the first sub-region 121 in the flat state is greater than the color temperature of the first white image displayed by the main display portion 110 in the flat state.

In the above embodiment, by increasing the effective light emitting area of the blue sub-pixel $P_{2B1}$ in the first edge pixel unit P21, on the one hand, the remaining space of the pixel region can be effectively utilized to realize adjustment of color temperature, and on the other hand, the problem that the service life of the blue sub-pixel is rapidly reduced can be avoided.

In the above embodiment, by keeping the effective light emitting area of the green sub-pixel $P_{2G1}$ in the first edge pixel unit P21 the same as that of the green sub-pixel $P_{1G}$ in the main pixel unit P1, on the one hand, space can be left for increasing the effective light emitting area of the blue sub-pixel, and on the other hand, the manufacturing process can be simplified.

In the present embodiment, the effective light emitting area of each sub-pixel can be controlled by changing the opening in the pixel defining layer. The bottom of the opening in the pixel defining layer exposes a pixel electrode (e.g., an anode of an organic light emitting diode). The area where the organic light emitting material filled in the opening directly contacts the pixel electrode through the opening can be considered as the effective light emitting area of the corresponding sub-pixel. In FIG. 1, a rectangular frame in each sub-pixel schematically represents the effective light emitting area of the sub-pixel.

With continued reference to FIG. 1, further, a ratio of the effective light emitting areas of the red sub-pixel $P_{2R2}$, the green sub-pixel $P_{2G2}$, and the blue sub-pixel $P_{2B2}$ in each second edge pixel unit P22 is X:(m2×Y):(n2×Z), where m2=m1, and n2>n1. A blue dye doping concentration of the light emitting layer of the blue sub-pixel $P_{2B2}$ in the second edge pixel unit P22 can be greater than or equal to the blue dye doping concentration of the light emitting layer of the blue sub-pixel $P_{2B1}$ in the first edge pixel unit P21. A green dye doping concentration of the light emitting layer of the green sub-pixel $P_{2G2}$ in the second edge pixel unit P22 is greater than the green dye doping concentration of the light emitting layer of the green sub-pixel $P_{2G1}$ in the first edge pixel unit P21.

With continued reference to FIG. 1, further, a ratio of the effective light emitting areas of the red sub-pixel $P_{2R3}$, the green sub-pixel $P_{2G3}$ and the blue sub-pixel $P_{2B3}$ in each third edge pixel unit P23 is X:(m3×Y):(n3×Z), where m3=m2, and n3>n2. A doping concentration of the light emitting layer of the blue sub-pixel $P_{2B3}$ in the third edge pixel unit P23 can be greater than or equal to the doping concentration of the light emitting layer of the blue sub-pixel $P_{2B2}$ in the second edge pixel unit P22. A doping concentration of the light emitting layer of the green sub-pixel $P_{2G3}$ in the third edge pixel unit P23 is greater than the doping concentration of the light emitting layer of the green sub-pixel $P_{2G2}$ in the second edge pixel unit P22.

In the above embodiment, the reference white image has a red color shift with respect to the first white image, and the second white image has a cyan color shift with respect to the first white image. However, the embodiments of the present disclosure are not limited thereto. In another embodiment, for example, the reference white image has a cyan color shift with respect to the first white image, and the second white image has a red color shift with respect to the first white image, correspondingly. In this case, the first sub-region 121, the second sub-region 122, and the third sub-region 123 are configured to display sub-white images with average color temperatures decreasing in sequence in the flat state.

The embodiments of the present disclosure do not limit the structure of the edge pixel unit P2, as long as the control of color temperature of the white light emitted by the edge pixel unit P2 can be realized. In another example m3>m2>m1>1, n3>n2>n1>1. In this case, the doping concentrations of light emitting layers of sub-pixels of the same color in pixel units of different sub-regions can be the same or different.

In the above embodiment, the pixel units in the first sub-region 121, the second sub-region 122, and the third sub-region 123 are configured to have different structures such that the color temperature of the first sub-white image displayed by the first sub-region 121 in the flat state, the second color temperature of the second sub-white image displayed by the second sub-region 122 in the flat state, and the third color temperature of the third sub-white image displayed by the third sub-region 123 in the flat state, are sequentially increased, but the embodiments of the present disclosure are not limited thereto. In another example, pixel units in the first sub-region 121, the second sub-region 122, and the third sub-region 123 are configured to have the same structure such that the color temperature of the first sub-white image displayed by the first sub-region 121 in the flat state, the second color temperature of the second sub-white image displayed by the second sub-region 122 in the flat state, and the third color temperature of the third sub-white image displayed by the third sub-region 123 in the flat state, are equal.

For example, in the above embodiment, the light emitting layer of each red sub-pixel is configured to emit red light, the light emitting layer of each green sub-pixel is configured to emit green light, and the light emitting layer of each blue sub-pixel is configured to emit blue light. The light emitting layers of sub-pixels of various colors are, for example, organic light emitting material layers.

In the above embodiment, each pixel unit in the main display portion and the edge display portion of the flexible display panel includes three sub-pixels of different colors from each other, but the embodiments of the present disclosure are not limited thereto. In another embodiment, each pixel unit in the main display portion and the edge display portion of the flexible display panel may include only two sub-pixels of different colors from each other. In further another embodiment, each pixel unit in the main display portion and the edge display portion of the flexible display panel may include only four sub-pixels of different colors from each other. For example, in a case where the main display portion in the flat state displays the first white image and the edge display portion in the flat state displays the second white image, an intensity ratio of the first color light emitted by the first color sub-pixel to the second color light emitted by the second color sub-pixel in the main display portion is different from an intensity ratio of the first color light emitted by the first color sub-pixel to the second color light emitted by the second color sub-pixel in the edge display portion. Thus, the color temperature of the first white image displayed by the main display portion and the color temperature of the second white image displayed by the edge display portion can be caused to be different.

Figure 2:
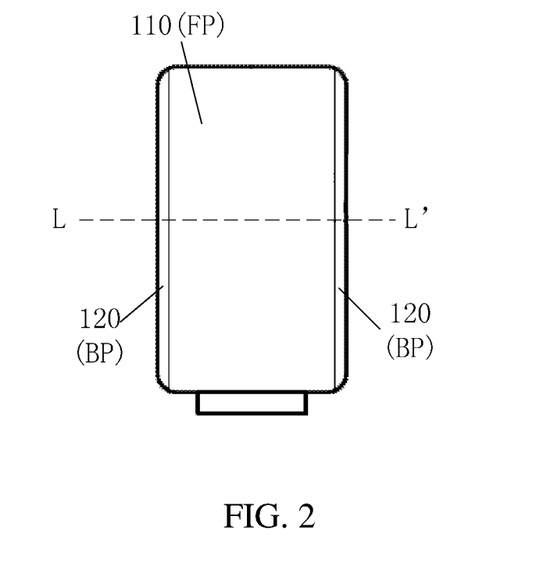
FIG. 2 shows a schematic top view of a display device provided by an embodiment of the present disclosure.
Figure 4:
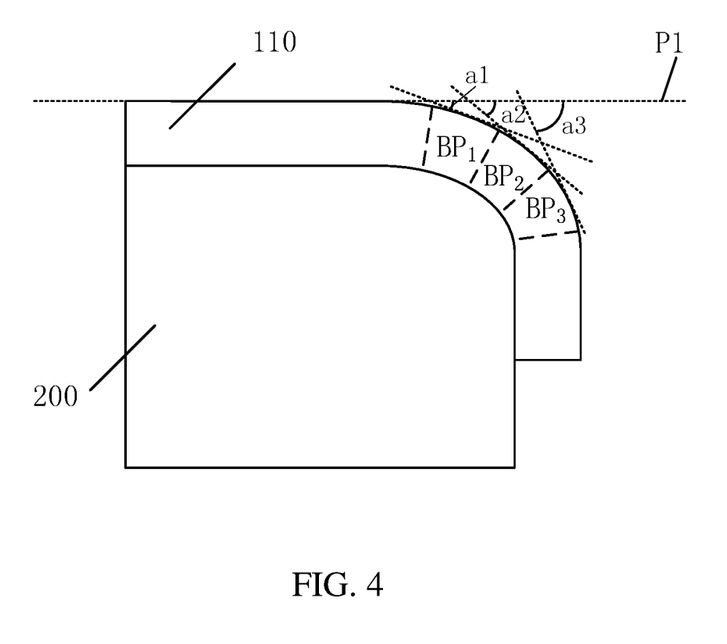
FIG. 4 is an enlarged view of a portion in the dashed frame of FIG. 3.

FIG. 2 is a schematic top view of a display device provided by an embodiment of the disclosure. An example of the display device is a portable telephone. FIG. 3 shows a schematic cross-sectional view of the display device provided by the embodiment of the present disclosure along line LL' in FIG. 2. FIG. 4 is an enlarged view of a portion in the dashed frame of FIG. 3.

Referring to FIG. 3, the display device 10 provided by the embodiment of the present disclosure includes: any one flexible display panel 100 described above and a support member 200.

The support member 200 has a flat support surface 210 and at least one bent support surface 220 adjacent to the flat support surface 210. In FIG. 3, the support member 200 has two bent support surfaces 220 located on opposite sides of the flat support surface 210. In addition, the support member 200 also has, for example, a back surface 240 opposite to the flat support surface 210 and two flat side surfaces 230 that are opposite to each other and connect the two bent support surfaces 220 to the back surface 240, respectively. In another example, the two bent support surfaces 220 of the support member 200 are directly connected to the back surface 240, so that the support member 200 may not include two flat side surfaces 230 opposite to each other.

The main display portion 110 of the flexible display panel 100 is bonded to the flat support surface 210 as a flat display portion FP of the display device 10; the two edge display portions 120 of the flexible display panel 100 are respectively bonded to the bent support surfaces 220 as bent display portions BP of the display device 10. Here, the flat display portion FP and the bent display portions BP of the display device 10 are not coplanar.

The main display portion 110 in the flat state is configured to display a first white image in the flat state at a first time instant. That is, the flat display portion FP of the display device 10 is configured to display the first white image at the first time instant. When the main display portion 110 in the flat state is driven to display the first white image, each main pixel unit P1 within the main display portion 110 is driven to display a white pixel point. The white pixel point displayed by each main pixel unit P1 has a corresponding color temperature. The arithmetic average value of the color temperatures of the white pixel points respectively displayed by all the main pixel units P1 in the main display portion 110 is the color temperature of the first white image displayed by the main display portion. For example, the color temperature of the first white image is 6500 K.

The edge display portion 120 is configured to display a third white image in the bending state at the first time instant. That is, the bent display portion BP of the display device 10 is configured to display the third white image at the first time instant. When the edge display portion 120 in the bending state is driven to display the third white image, each edge pixel unit P2 within the edge display portion 120 is driven to display a white pixel point. The white pixel point displayed by each edge pixel unit P2 has a corresponding color temperature. The arithmetic average value of the color temperatures of the white pixel points respectively displayed by all the edge pixel units P2 in the edge display portion 120 in the being state is the color temperature of the third white image displayed by the edge display portion 120. The flat display portion FP and the bent display portion BP of the display device 10 are configured to respectively display the first white image and the third white image at the same time instant. For example, the difference between the color temperature of the first white image and the color temperature of the third white image is less than or equal to 500 K. For example, the color temperature of the first white image is 6500 K, and the color temperature of the third white image is 6700 K. For another example, the color temperature of the first white image is 6500 K, and the color temperature of the third white image is also 6500 K.

With continued reference to FIG. 3, the bent support surface 220 of the support member 200 has a cross-sectional shape of a curve. Here, the curve is the shape of a part of a circle or an ellipse. In another example, the bent support surface 220 of the support member 200 can also have a cross-sectional shape of a straight line; in further another example, the curved support surface 220 of the support member 200 can also have a cross-sectional shape of a combination of a straight line and a curve. The embodiments of the present disclosure do not limit the shape of the curved support surface.

The sectional view of FIG. 4 shows that the first sub-region 121, the second sub-region 122 and the third sub-region 123 of the edge display portion 120 of the flexible display panel 100 are bonded to the bent support surface 220 to be in a bending state and act as a first sub-portion $BP_1$, a second sub-portion $BP_2$ and a third sub-portion $BP_3$ of the bent display portion BP of the display device 10, respectively.

In FIG. 1, the first sub-region 121, the second sub-region 122, and the third sub-region 123 are adjacent to each other. In FIG. 4, the first sub-region 121, the second sub-region 122 and the third sub-region 123 in the bending state are respectively taken as the first sub-portion $BP_1$, the second sub-portion $BP_2$ and the third sub-portion $BP_3$ of the display device. The first sub-portion $BP_1$, the second sub-portion $BP_2$ and the third sub-portion $BP_3$ are adjacent to each other. However, the embodiments of the present disclosure are not limited thereto. In another example, there may be other display portions between the first sub-region 121 and the second sub-region 122; and there may be other display portions between the second sub-region 122 and the third sub-region 123. A bent display portion may also exist between the first sub-portion BPI and the second sub-portion $BP_2$, and a bent display portion may also exist between the second sub-portion $BP_2$ and the third sub-portion $BP_3$.

In one example, the first sub-region 121 is configured to display a first sub-white image having a first color temperature in the flat state. For example, the first color temperature is 8500 K. The first sub-region 121 is configured to display a fourth sub-white image having a fourth color temperature in the bending state, that is, the first sub-portion BPI of the bent display portion BP of the display device 10 is configured to display a fourth sub-white image having a fourth color temperature. For example, the fourth color temperature is 6500 K. Here, a driving signal for driving the first sub-region 121 to display the first sub-white image having the first color temperature in the flat state is the same as a driving signal for driving the first sub-region 121 to display the fourth sub-white image having the fourth color temperature in the bending state. That is, a small red color shift of the first sub-region 121 due to bending and a small cyan color shift of the first sub-region 121 carried by itself can cancel each other out to present a color characteristic more consistent with that of the main display portion 110, such as substantially the same color temperature.

The second sub-region 122 is configured to display a second sub-white image having a second color temperature in the flat state. For example, the second color temperature is 9500 K. The second sub-region 122 is configured to display a fifth sub-white image having a fifth color temperature in the bending state, that is, the second sub-portion $BP_2$ of the bent display portion BP of the display device 10 is configured to display a fifth sub-white image having a fifth color temperature. For example, the fifth color temperature is 6500 K. Here, a driving signal for driving the second sub-region 122 to display the second sub-white image having the second color temperature in the flat state is the same as a driving signal for driving the second sub-region 122 to display the fifth sub-white image having the fifth color temperature in the bending state. That is, a medium red color shift of the second sub-region 122 due to bending and a medium cyan color shift of the second sub-region 122 carried by itself can cancel each other out to present a color characteristic more consistent with that of the main display portion 110, such as substantially the same color temperature.

The third sub-region 123 is configured to display a third sub-white image having a third color temperature in the flat state. For example, the third color temperature is 10500 K. The third sub-region 123 is configured to display a sixth sub-white image having a sixth color temperature in a bending state, that is, the third sub-portion $BP_3$ of the bent display portion BP of the display device 10 is configured to display a sixth sub-white image having a sixth color temperature. For example, the sixth color temperature is 6500 K. Here, a driving signal for driving the third sub-region 123 to display the third sub-white image having the third color temperature in the flat state is the same as a driving signal for driving the third sub-region 123 to display the sixth sub-white image having the sixth color temperature in the bending state. That is, a large red color shift of the third sub-region 123 due to bending and a large cyan color shift of the third sub-region 123 carried by itself can cancel each other out to present a color characteristic more consistent with that of the main display portion 110, such as substantially the same color temperature.

In this way, gradual color shift caused after the first sub-region 121, the second sub-region 122, and the third sub-region 123 of the edge display portion 120 are attached to the bent support surface is correspondingly compensated. Therefore, a more uniform white balance of all display portions of the display device can be realized.

In another example, a maximum difference between the fourth color temperature, the fifth color temperature, and the sixth color temperature is less than or equal to 200 K.

In the present embodiment, the bending of the flexible display panel causes a red color shift, so the first color temperature, the second color temperature, and the third color temperature are sequentially increased. It can be understood that, if the bending of the flexible display panel causes a blue color shift, the first color temperature, the second color temperature and the third color temperature can be sequentially decreased.

In the embodiment shown in FIGS. 3 and 4, the edge display portion 120 of the flexible display panel 100 is completely located on the bent support surface 220. In another example, the edge display portion 120 of the flexible display panel 100 can be further located on the side surface 230 of the support member 200.

The main display portion 110 of the flexible display panel 100 includes a plurality of main pixel units P1 arranged in an array, and each edge display portion 120 includes a plurality of edge pixel units P2 arranged in an array. The description of the plurality of main pixel units P1 and the plurality of edge pixel units P2 in the present embodiment can be referred to the corresponding description of the flexible display panel 100 shown in FIG. 1.

Each main pixel unit P1 includes a red sub-pixel $P_{1R}$, a green sub-pixel $P_{1G}$, and a blue sub-pixel $P_{1B}$. Each edge pixel unit P2 includes a red sub-pixel $P_{2R}$, a green sub-pixel $P_{2G}$, and a blue sub-pixel $P_{2B}$. For example, each first edge pixel unit P21 in the first sub-region 121 includes a red sub-pixel $P_{2R1}$, a green sub-pixel $P_{2G1}$, and a blue sub-pixel $P_{2B1}$; each second edge pixel unit P22 in the second sub-region 122 includes a red sub-pixel $P_{2R2}$, a green sub-pixel $P_{2G2}$, and a blue sub-pixel $P_{2B2}$; each third edge pixel unit P23 in the third sub-region 123 includes a red sub-pixel $P_{2R3}$, a green sub-pixel $P_{2G3}$, and a blue sub-pixel $P_{2B3}$.

In the present embodiment, a ratio of effective light emitting areas of the red sub-pixel $P_{1R}$, the green sub-pixel $P_{1G}$, and the blue sub-pixel $P_{1B}$ in each main pixel unit P1 is X:Y:Z. A ratio of effective light emitting areas of the red sub-pixel $P_{2R1}$, the green sub-pixel $P_{2G1}$, and the blue sub-pixel $P_{2B1}$ in each first edge pixel unit P21 is X:(m1×Y):(n1×Z), where m1 is greater than or equal to 1, and n1 is greater than or equal to 1.1. In one example, m1 is equal to 1 and n1 is equal to 1.5. A doping concentration of the light emitting layer of the blue sub-pixel $P_{2B1}$ in the first edge pixel unit P21 can be greater than or equal to a doping concentration of the light emitting layer of the blue sub-pixel $P_{1B}$ in the main pixel unit P1. Therefore, when the main pixel unit P1 and the first edge pixel unit P21 are driven to emit white light, a ratio of blue light to red light in the white light emitted by the first edge pixel unit P21 can be greater than a ratio of blue light to red light in the white light emitted by the main pixel unit P1. In addition, a doping concentration of the light emitting layer of the green sub-pixel $P_{2G1}$ in the first edge pixel unit P21 is greater than a doping concentration of the light emitting layer of the green sub-pixel $P_{1G}$ in the main pixel unit P1. Thus, when the main pixel unit P1 and the first edge pixel unit P21 are driven to emit white light, a ratio of green light to red light in the white light emitted by the first edge pixel unit P21 can be greater than a ratio of green light to red light in the white light emitted by the main pixel unit P1.

With continued reference to FIG. 1, further, a ratio of the effective light emitting areas of the red sub-pixel $P_{2R2}$, the green sub-pixel $P_{2G2}$, and the blue sub-pixel $P_{2B2}$ in each second edge pixel unit P22 is X:(m2×Y):(n2×Z), where m2=m1, and n2>n1. A doping concentration of the light emitting layer of the blue sub-pixel $P_{2B2}$ in the second edge pixel unit P22 can be greater than or equal to the doping concentration of the light emitting layer of the blue sub-pixel $P_{2B1}$ in the first edge pixel unit P21. A doping concentration of the light emitting layer of the green sub-pixel $P_{2G2}$ in the second edge pixel unit P22 is greater than the doping concentration of the light emitting layer of the green sub-pixel $P_{2G1}$ in the first edge pixel unit P21.

With continued reference to FIG. 1, further, a ratio of the effective light emitting areas of the red sub-pixel $P_{2R3}$, the green sub-pixel $P_{2G3}$ and the blue sub-pixel $P_{2B3}$ in each third edge pixel unit P23 is X:(m3×Y):(n3×Z), where m3=m2, and n3>n2. A doping concentration of the light emitting layer of the blue sub-pixel $P_{2B3}$ in the third edge pixel unit P23 can be greater than or equal to the doping concentration of the light emitting layer of the blue sub-pixel $P_{2B2}$ in the second edge pixel unit P22. A doping concentration of the light emitting layer of the green sub-pixel $P_{2G3}$ in the third edge pixel unit P23 is greater than the doping concentration of the light emitting layer of the green sub-pixel $P_{2G2}$ in the second edge pixel unit P22.

Referring to FIG. 4, a surface of the flat display portion FP of the display device 10 away from the support member 200 is located in a first plane P1. In the cross-sectional view shown in FIG. 4, a tangent line of a surface of the first sub-portion BPI of the bent display portion BP away from the surface of the support member 200, forms a first included angle a1 with the first plane P1; a tangent line of a surface of the second sub-portion $BP_2$ of the bent display portion BP away from the surface of the support member 200 forms a second included angle a2 with the first plane P1; a tangent line of a surface of the third sub-portion $BP_3$ of the bent display portion BP away from the surface of the support member 200 forms a third included angle a3 with the first plane P1. The first included angle a1, the second included angle a2 and the third included angle a3 are all acute angles, and a1<a2<a3. That is, the degree of bending of the first sub-part $BP_1$, the second sub-part $BP_2$, and the third sub-part $BP_3$ of the bent display portion BP gradually increases, and the red color shift due to bending also gradually increases. For example, the color shift in the embodiments of the present disclosure refers to a front viewing color shift that can be observed when the central line of the observer's sight is perpendicular to the part of the main display portion 110 in the flat state.

In the embodiments of the present disclosure, the first sub-region 121, the second sub-region 122, and the third sub-region 123 are configured to display sub-white images with gradually increasing color temperatures in a flat state. That is, in the flat state, the cyan color shift of the sub-white images displayed by the first sub-region 121, the second sub-region 122, and the third sub-region 123 sequentially increases. In this way, when the first sub-region 121, the second sub-region 122, and the third sub-region 123 are in the bending state shown in FIGS. 3 and 4, a small red color shift caused by the bending of the first sub-region 121 having the small bending angle a1 is compensated by the small cyan color shift caused by the pixel structure of the first sub-region 121 itself; a medium red color shift caused by the bending of the second sub-region 122 having the medium bending angle a2 is compensated by the medium cyan color shift caused by the pixel structure of the second sub-region 122 itself; a large red color shift caused by the bending of the third sub-region 123 having the large bending angle a3 is compensated by the large cyan color shift caused by the pixel structure of the third sub-region 123 itself. Therefore, a front viewing white balance effect can be realized, thus improving the color shift problem in the bending region during front viewing.

It should be noted that, in the above-described embodiment, the edge display portion 120 of the flexible display panel 100 includes three sub-regions 121, 122, and 123 with gradually varying color temperatures, but the flexible display panel provided by the embodiment of the present disclosure is not limited thereto. In another embodiment, the edge display portion 120 of the flexible display panel can include four or more sub-regions with gradually varying color temperatures in a direction away from the main display portion 110 in the flat state; in further another embodiment, the edge display portion 120 of the flexible display panel can include only two sub-regions with gradually varying color temperatures in the direction away from the main display portion 110 in the flat state; in still another embodiment, the edge display portion 120 of the flexible display panel includes only one sub-region in the flat state, that is, the entire edge display portion 120 of the flexible display panel has the same color temperature.

In the above embodiment, the bent display portion BP of the display device 10 includes three sub-portions corresponding to the flexible display panel 100, but the display device provided by the embodiment of the present disclosure is not limited thereto. In another embodiment, the bent display portion BP of the display device 10 can include four or more sub-portions corresponding to the flexible display panel 100; in further another embodiment, the bent display portion BP of the display device 10 can include only two sub-portions corresponding to the flexible display panel 100; in still another embodiment, the bent display portion BP of the display device 10 can include only one sub-region corresponding to the flexible display panel 100, that is, the bent display portion BP itself.

It can be understood that, the display device provided by the embodiment of the present disclosure is not limited to a portable phone, but can include various display devices, such as a television, a notebook computer, an electronic advertisement board, a wearable device, and so on.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. It should be understood that, in a case where a component or element such as a layer, film, area, substrate or the like, is referred to be "on" or "under" another component or element, it may be directly on or under the another component or element, or a component or element is interposed therebetween.

(3) In case of no conflict, features in one embodiment or in different embodiments of the present disclosure can be combined.

Although the present disclosure has been described in detail with general descriptions and specific embodiments above, it is obvious to those skilled in the art that some modifications or improvements can be made to the embodiments of the present disclosure. Therefore, all such modifications or improvements made without departing from the spirit of this disclosure are within the scope of protection claimed in the present disclosure.

What is claimed is:

1. A flexible display panel comprising: a first display portion and a second display portion connected with the first display portion, wherein a color temperature of a first white image displayed by the first display portion in a flat state is different from a color temperature of a second white image displayed by the second display portion in the flat state, wherein the flexible display panel is an electroluminescent display panel, and each pixel unit in the first display portion and the second display portion comprises at least a first primary color sub-pixel and a second primary color sub-pixel, in a case where the first display portion in the flat state displays the first white image and the second display portion in the flat state displays the second white image, an intensity ratio of light emitted by the second primary color sub-pixel in the first display portion to light emitted by the first primary color sub-pixel in the first display portion is different from an intensity ratio of light emitted by the second primary color sub-pixel in the second display portion to light emitted by the first primary color sub-pixel in the second display portion.

2. The flexible display panel according to claim 1, wherein
an effective light emitting area of the second primary color sub-pixel in the second display portion is larger than an effective light emitting area of the second primary color sub-pixel in the first display portion.

3. The flexible display panel according to claim 1, wherein
a dye doping concentration of a light emitting layer of the second primary color sub-pixel in the first display portion is smaller than a dye doping concentration of a light emitting layer of the second primary color sub-pixel in the second display portion.

4. The flexible display panel according to claim 1, wherein a difference between the color temperature of the first white image and the color temperature of the second white image is greater than or equal to 2000 K.

5. The flexible display panel according to claim 1, wherein the color temperature of the first white image is less than the color temperature of the second white image.

6. The flexible display panel according to claim 1, wherein the first display portion and the second display portion are directly connected.

7. The flexible display panel according to claim 1, wherein
a part of the first display portion is configured to display a reference white image in a bending state, the reference white image having a color shift of a first color with respect to the first white image,
the second white image has a color shift of a second color with respect to the first white image,
the first color and the second color are complementary colors to each other.

8. The flexible display panel according to claim 1, wherein
each pixel unit in the first display portion and the second display portion further comprises a third primary color sub-pixel,
a ratio of effective light emitting areas of the first primary color sub-pixel, the second primary color sub-pixel and the third primary color sub-pixel in each pixel unit of the first display portion is X:Y:Z,
a ratio of effective light emitting areas of the first primary color sub-pixel, the second primary color sub-pixel and the third primary color sub-pixel in each pixel unit of at least a first sub-region of the second display portion is X:(m1×Y):(n1×Z), where m1 is greater than or equal to 1, and n1 is greater than or equal to 1.1.

9. The flexible display panel according to claim 8, wherein
a ratio of effective light emitting areas of the first primary color sub-pixel, the second primary color sub-pixel and the third primary color sub-pixel in each pixel unit of at least a second sub-region of the second display portion is X:(m2×Y):(n2×Z), where m2>m1, and n2>n1;
the second sub-region is further away from the first display portion than the first sub-region.

10. The flexible display panel according to claim 9, wherein
in a case where the first display portion in the flat state displays the first white image and the second display portion in the flat state displays the second white image, color temperatures of the first white image, a first sub-white image displayed in the first sub-region and a second sub-white image displayed in the second sub-region sequentially increase or sequentially decrease.

11. The flexible display panel according to claim 8, wherein the first primary color sub-pixel, the second primary color sub-pixel and the third primary color sub-pixel are a red sub-pixel, a green sub-pixel and a blue sub-pixel, respectively.

12. A display device comprising: a support member and the flexible display panel according to claim 1, wherein the support member has a flat support surface and a bent support surface adjacent to each other, the first display portion of the flexible display panel is bonded to the flat support surface as a flat display portion, and the second display portion of the flexible display panel is bonded to the bent support surface as a bent display portion.

13. The display device according to claim 12, wherein the bent display portion is configured to display a third white image, and a difference between the color temperature of the first white image and a color temperature of the third white image is less than or equal to 500 K.

14. The display device according to claim 12, wherein each pixel unit in the flat display portion and the bent display portion further comprises a first primary color sub-pixel, a second primary color sub-pixel, and a third primary color sub-pixel,
a ratio of effective light emitting areas of the first primary color sub-pixel, the second primary color sub-pixel and the third primary color sub-pixel in each pixel unit of the flat display portion is X:Y:Z,
a ratio of effective light emitting areas of the first primary color sub-pixel, the second primary color sub-pixel and the third primary color sub-pixel in each pixel unit of at least a first sub-portion of the bent display portion is X:(m1×Y):(n1×Z), where m1≥1, and n1≥1.1.

15. The display device according to claim 14, wherein
a ratio of effective light emitting areas of the first primary color sub-pixel, the second primary color sub-pixel and the third primary color sub-pixel in each pixel unit of at least a second sub-portion of the bent display portion is X:(m2×Y):(n2×Z), where m2≥m1, and n2≥n1;
the second sub-portion is further away from the flat display portion than the first sub-portion.

16. The display device according to claim 15, wherein
the first sub-portion is configured to display a fourth sub-white image, the second sub-portion is configured to display a fifth sub-white image, and a difference between a color temperature of the fourth sub-white image and a color temperature of the fifth sub-white image is less than or equal to 200 K.

17. The display device according to claim 14, wherein the first primary color sub-pixel, the second primary color sub-pixel and the third primary color sub-pixel are a red sub-pixel, a green sub-pixel and a blue sub-pixel, respectively.

18. The display device according to claim 15, wherein a surface of the flat display portion away from the support member is located in a first plane,
in a cross-section of the display device, the bent support surface has a curved shape, a tangent line of a surface of the first sub-portion away from the support member forms a first included angle a1 with the first plane, a tangent line of a surface of the second sub-portion away from the support member forms a second included angle a2 with the first plane, the first included angle a1 and the second included angle a2 are both acute angles, and the second included angle a2 is larger than the first included angle a1.

19. The flexible display panel according to claim 1, wherein the second display portion is at the periphery of the first display portion.

* * * * *